United States Patent
Shi

(10) Patent No.: US 10,269,318 B2
(45) Date of Patent: Apr. 23, 2019

(54) LIQUID CRYSTAL DISPLAY DEVICE AND GOA CIRCUIT OF THE SAME

(71) Applicant: Shenzhen China Star Optoelectronics Technology Co., Ltd., Shenzhen, Guangdong (CN)

(72) Inventor: Longqiang Shi, Guangdong (CN)

(73) Assignee: Shenzhen China Star Optoelectronics Semiconductor Display Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 15/545,652

(22) PCT Filed: Apr. 26, 2017

(86) PCT No.: PCT/CN2017/081976
§ 371 (c)(1),
(2) Date: Jul. 21, 2017

(87) PCT Pub. No.: WO2018/188119
PCT Pub. Date: Oct. 18, 2018

(65) Prior Publication Data
US 2018/0293951 A1    Oct. 11, 2018

(30) Foreign Application Priority Data

Apr. 10, 2017 (CN) .......................... 2017 1 0229984

(51) Int. Cl.
*G09G 3/36* (2006.01)
*G02F 1/1345* (2006.01)

(52) U.S. Cl.
CPC ....... *G09G 3/3677* (2013.01); *G02F 1/13454* (2013.01); *G09G 2310/06* (2013.01); *G09G 2310/08* (2013.01)

(58) Field of Classification Search
CPC ............. G09G 3/3677; G09G 2310/06; G09G 2310/08; G02F 1/13454
See application file for complete search history.

(56) References Cited

U.S. PATENT DOCUMENTS

| 2008/0101529 | A1 | 5/2008 | Tobita |
| 2016/0260403 | A1 | 9/2016 | Dai |
| 2016/0275895 | A1* | 9/2016 | Dai .......................... G09G 3/36 |
| 2016/0284296 | A1 | 9/2016 | Dai |

FOREIGN PATENT DOCUMENTS

| CN | 106205528 A | 12/2016 |
| CN | 106328084 A | 1/2017 |

* cited by examiner

Primary Examiner — Andrew Sasinowski
(74) Attorney, Agent, or Firm — Andrew C. Cheng

(57) ABSTRACT

A liquid crystal display device and a GOA circuit of the same are provided. The GOA circuit includes multiple cascaded GOA units, wherein an N-th stage GOA unit of the multiple cascaded GOA units comprises: a pull-up control module, a pull-up module, a transmission module, a pull-down module, a pull-down maintaining module and a bootstrap capacitor. The GOA circuit can ensure to finish a displaying and driving of liquid crystals, greatly simplify the circuit design, save the cost of the circuit, and reduce the size of the GOA circuit so that the liquid crystal display device can have a design space for a narrower frame.

17 Claims, 3 Drawing Sheets

LIQUID CRYSTAL DISPLAY DEVICE AND GOA CIRCUIT OF THE SAME

BACKGROUND OF THE INVENTION

1. Field of the Invention

The present invention relates to a liquid crystal display technology field, and more particularly to a liquid crystal display device and a GOA circuit of the same.

2. Description of Related Art

A GOA circuit based on a-Si is widely applied in various sizes of display devices. The GOA technology is beneficial for decreasing the cost, and a narrow frame design.

FIG. 1 is a schematic diagram of a GOA circuit in the conventional art. In one stage of the GOA circuit, 17 TFTs are adopted. However, for an amorphous silicon GOA circuit, the increase of the number of TFT will increase the size of the frame. In the trend of the development of the narrow frame, the structure of the GOA circuit in the conventional art cannot meet the design requirement of a narrow frame.

SUMMARY OF THE INVENTION

The embodiments of the present invention provides a liquid crystal display device and a GOA circuit of the same, which can solve the technology problem of not narrow enough of the display frame because of the complex structure of the GOA circuit.

In order to solve the above problem, the embodiment of the present invention provides a GOA circuit comprising multiple cascaded GOA units, wherein a N-th stage GOA unit of the multiple cascaded GOA units comprises: a pull-up control module, a pull-up module, a transmission module, a pull-down module, a pull-down maintaining module and a bootstrap capacitor; wherein, the pull-up control module is connected with the transmission module and a pull-down maintaining module, one terminal of the bootstrap capacitor is connected to the transmission module and the pull-up module, the pull-down module is connected to the transmission module and a scanning line of the present stage, the pull-down maintaining module and the pull-down module are also connected with a pull-down signal line, and the pull-up module is connected with a clock signal line and the scanning line of the present stage.

In order to solve the above technology, the embodiment of the present invention also provides a liquid crystal display device, and the liquid crystal display device includes anyone of the GOA circuits in the above embodiments.

Comparing to the conventional art, the liquid crystal display device and the GOA circuit of the same of the present invention can ensure to finish a displaying and driving of liquid crystals, greatly simplify the circuit design, save the cost of the circuit, and reduce the size of the GOA circuit so that the liquid crystal display device can have a design space for a narrower frame.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the person of ordinary skill in the art without creative effort, it can also obtain other figures according to these figures.

DETAILED DESCRIPTION OF THE PREFERRED EMBODIMENT

The following content combines with the drawings and the embodiment for describing the present invention in detail. It is obvious that the following embodiments are only some embodiments of the present invention. For the person of ordinary skill in the art without creative effort, the other embodiments obtained thereby are still covered by the present invention.

The embodiment of the present invention firstly provides a GOA circuit, and the GOA circuit includes multiple cascaded GOA units. The connection and control relationship of the cascaded GOA units is in an understandable range for a person of ordinary skill the art, no more repeating. The following will describe an N-th GOA unit in detail.

Figure 1:
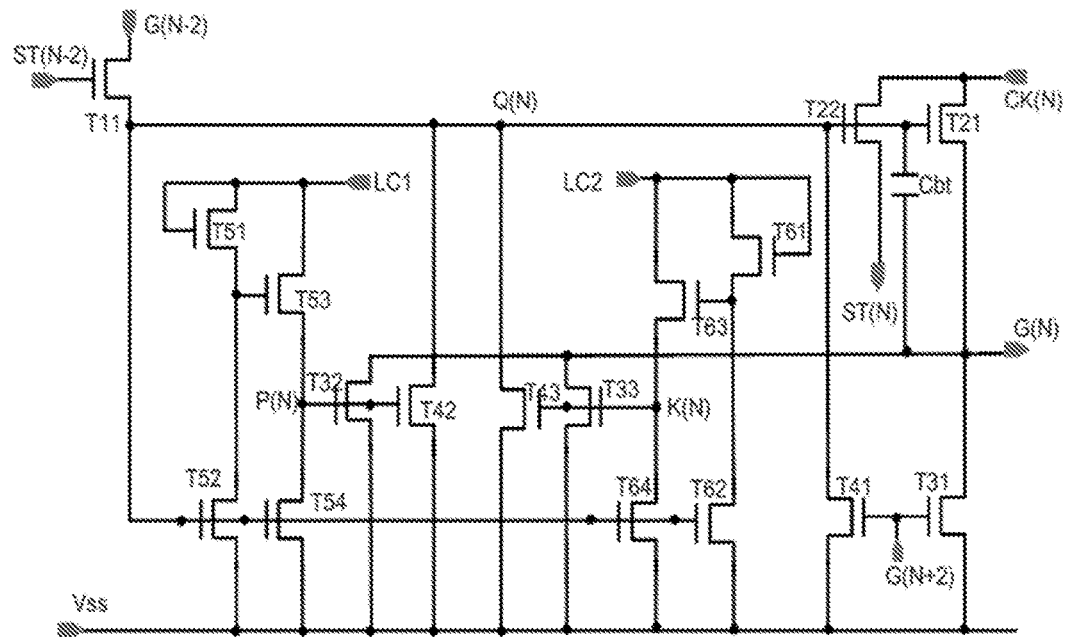
FIG. 1 is a schematic diagram of a common GOA circuit in the conventional art.
Figure 2:
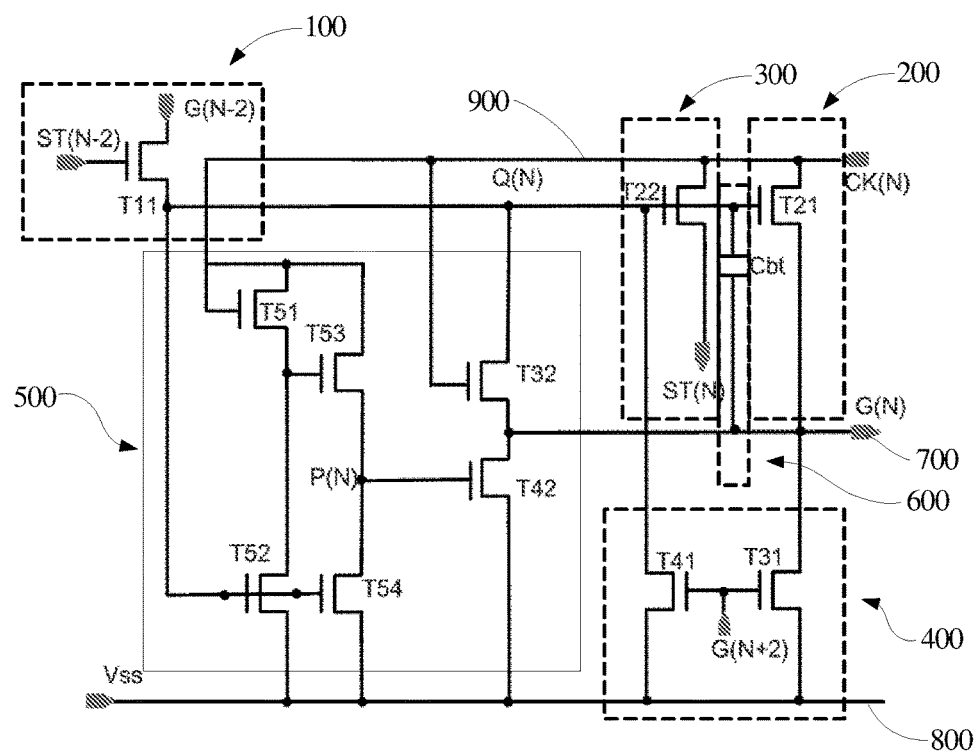
FIG. 2 is a schematic circuit diagram of a N-th GOA unit according to an embodiment of the present invention.

With reference to FIG. 2, and FIG. 2 is a schematic circuit diagram of an N-th GOA unit according to an embodiment of the present invention. The N-th GOA unit includes a pull-up control module 100, a pull-up module 200, a transmission module 300, a pull-down module 400, a pull-down maintaining module 500 and a bootstrap capacitor 600.

Specifically, the pull-up control module 100 is connected with the transmission module 300 and a pull-down maintaining module 500. One terminal of the bootstrap capacitor 600 is connected to the transmission module 300 and the pull-up module 200. The pull-down module 400 is connected to the transmission module 300 and the scanning line 700 of the present stage. The pull-down maintaining module 500 and the pull-down module 400 are also connected with a pull-down signal line 800. The pull-up module 200 is connected with a clock signal line 900 and the scanning line 700 of the present stage.

Wherein, the pull-up control module 100 includes a first thin-film transistor T11, a gate of the first thin-film transistor T11 is used for receiving a trigger signal ST(N−2) of a (N−2)-th stage GOA unit, a source of the first thin-film transistor T11 is used for connecting a scanning line signal G(N−2) of the (N−2)-th stage GOA unit, and a drain of the first thin-film transistor T11 is connected with the transmission module 300 and the pull-down maintaining module 500.

The transmission module 300 includes a second thin-film transistor T22. A gate of the second thin-film transistor T22 is connected with the drain of the first thin-film transistor T11, a source of the second thin-film transistor T22 is connected with the clock signal line 900, and a drain of the second thin-film transistor T22 is used for outputting a trigger signal ST(N) of the present stage GOA unit.

The pull-up module 200 includes a third thin-film transistor T21, a gate of the third thin-film transistor T21 is connected with the drain of the first thin-film transistor T11, a source of the third thin-film transistor T21 is connected with the clock signal 900, and a drain of the third thin-film transistor T21 is connected with the scanning line 700 of the present stage.

One terminal of the bootstrap capacitor 600 is connected with the gate of the second thin-film transistor T22 and the gate of the third thin-film transistor T21, and the other terminal of the bootstrap capacitor 600 is connected with the scanning line 700 of the present stage.

The pull-down module 400 includes a fourth thin-film transistor T41 and a fifth thin-film transistor T31. A gate of the fourth thin-film transistor T41 is used for receiving a scanning line signal G(N+2) of a (N+2)-th stage GOA unit, a source of the fourth thin-film transistor T41 is connected with the drain of the first thin-film transistor T11, a drain of the fourth thin-film transistor T41 is connected with the pull-down signal line 800. A gate of the fifth thin-film transistor T31 is used for receiving the scanning line signal G(N+2) of the (N+2)-th stage GOA unit, a source of the fifth thin-film transistor T31 is connected with the scanning line 700 of the present stage, and a drain of the fifth thin-film transistor T31 is connected with the pull-down signal line 800.

The pull-down maintaining module 500 includes a sixth thin-film transistor T51, a seventh thin-film transistor T53, an eighth thin-film transistor T32, a ninth thin-film transistor T42, a tenth thin-film transistor T52 and an eleventh thin-film transistor T54. A gate of the sixth thin-film transistor T51 is connected with the clock signal line 900, a source of the sixth thin-film transistor T51 is connected with a source of the seventh thin-film transistor T53, a drain of the sixth thin-film transistor T51 is connected with a gate of the seventh thin-film transistor T53, and a source of the tenth thin-film transistor T52. A drain of the seventh thin-film transistor T53 is connected with a gate of the ninth thin-film transistor T42 and a source of the eleventh thin-film transistor T54. A gate of the eighth thin-film transistor T32 is connected with the clock signal line 900, a source of the eighth thin-film transistor T32 is connected with the drain of the first thin-film transistor T11, and a drain of the eighth thin-film transistor T32 is connected with the scanning line 700 of the present stage and a source of the ninth thin-film transistor T42. A drain of the ninth thin-film transistor T42 is connected with the pull-down signal line 800. A gate of the tenth thin-film transistor T52 is connected with a drain of the first thin-film transistor T11. A drain of the tenth thin-film transistor T52 is connected with the pull-down signal line 800. A gate of the eleventh thin-film transistor T54 is connected with a drain of the first thin-film transistor T11, a drain of the eleventh thin-film transistor T54 is connected with the pull-down signal line 800.

Wherein, the source of the eighth thin-film transistor T32 is connected with the drain of the first thin-film transistor T11 through a first node Q(N); the drain of the seventh thin-film transistor T53, the gate of the ninth thin-film transistor T42 and the source of the eleventh thin-film transistor T54 are connected with each other through a second node P(N).

Figure 3:
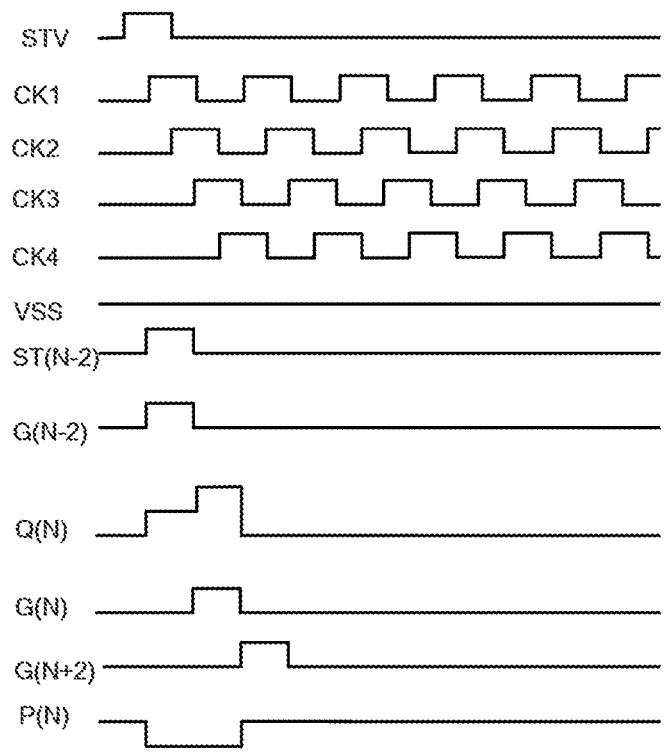
FIG. 3 is a waveform diagram of driving signals of a GOA circuit in the present embodiment.

With reference to FIG. 3, and FIG. 3 is a waveform diagram of driving signals of the GOA circuit according to an embodiment of the present invention. The GOA circuit of the present embodiment adopts four clock signals, CK1, CK2, CK3 and CK4, which are high frequency alternating current power source. Each overlap time of the clock signals is H. A pulse width of the clock signal is 2 H, and a duty ratio is 50%. A high voltage level of the clock signal is 28V (adjustable). A low voltage level of the clock signal can be −8V (adjustable). STV is a trigger signal, and is a high frequency alternating current power source, and a pulse width is 2 H. The STV signal is turned on each frame, a high voltage level is 28V, a low voltage level is −8V; the overlap of the STV and CK1 is H; VSS DC is a direct current power source, and is −6 v (adjustable). Q(N), G(N), ST(N−2), ST(N) and P(N) are important nodes in the circuit.

Figure 4:
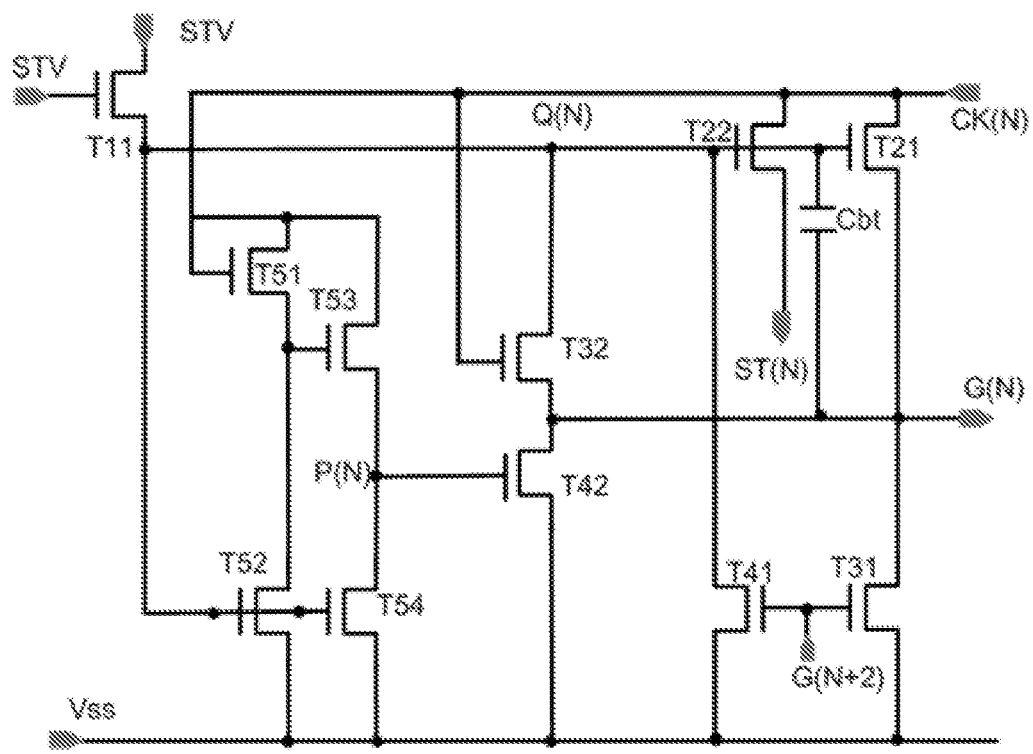
FIG. 4 is a schematic diagram of previous two stages of the GOA unit in the embodiment shown in FIG. 2.
Figure 5:
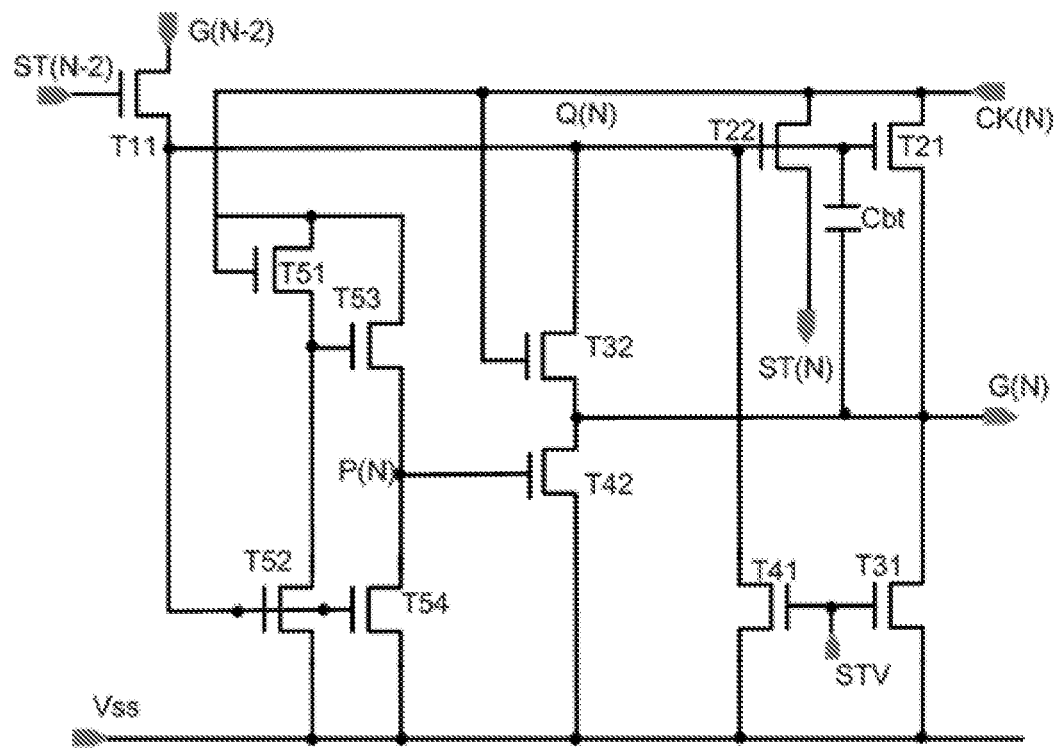
FIG. 5 is a schematic diagram of last two stages of the GOA units in the GOA circuit of the present invention.

The following adopts an N-th stage GOA circuit as an example for illustrating conceptually. Furthermore, with reference to FIG. 4 and FIG. 5, FIG. 4 is a schematic circuit diagram of previous two stages of the GOA unit in the embodiment in FIG. 2, and FIG. 5 is a schematic circuit diagram of last two stages of the GOA unit of the GOA circuit of the present invention. The thin-film transistor T11 in the pulling-up module of the GOA unit in FIG. 4 adopts STV to control a gate and a drain of the thin-film transistor T11. The pull-down unit of the GOA unit in FIG. 5 adopts STV to control.

According to the waveforms shown in FIG. 3, G(N) is controlled by CK3, G(N−2) is controlled by CK1, G(N+2) is controlled by CK1.

When G(N−2) is working: when G(N−2), ST(N−2) are at a high level, the high level of the G(N−2) is inputted to Q(N), T21 is turned on. At this time, CK(N)=CK3, which is a low level, and G(N) outputs a low level.

When G(N) is working: CK3 becomes a high level, G(N) outputs a high level, Q(N) will generate a higher voltage level because of capacitive coupling effect. Besides, at this time, G(N−2), ST(N−2) are at a low level, which will not affect the high level of the Q point; when G(N+2) is working: G(N+2) is a high level, at this time, T31 and T41 are turned on, Q(N) and G(N) are pulled down to a low level.

Subsequently, CK3 will be at a high level periodically so that when P(N) is at a high level, T42 will be turned on periodically, and G(N) will reach a low voltage level well. At the same time, because T32 is controlled by CK(N), T32 will be turned on periodically so that Q(N) will maintained at a low voltage level well.

The number of TFTs is less in the present patent, which is beneficial to a narrow frame design. Besides, because T32 and T42 are connected in series, the resistance become larger, which decrease the risk of pulling down the high voltage level of Q(N) to a low voltage level because of current leakage of TFT so as to ensure a normal waveform of Q(N) and ensure a normal turning-on of G(N).

The GOA circuit provided by the present invention can ensure to finish a displaying and driving of liquid crystals, greatly simplify the circuit design, save the cost of the circuit, and reduce the size of the GOA circuit so that the liquid crystal display device can have a design space for a narrower frame.

Figure 6:
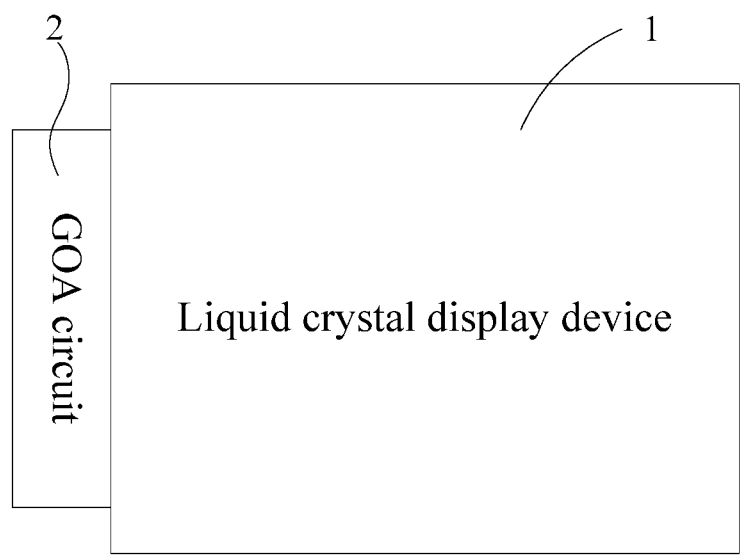
FIG. 6 is a schematic diagram of a liquid crystal display device according to an embodiment of the present invention.

Besides, the embodiment of the present invention also provides a liquid crystal display device. With reference to FIG. 6, and FIG. 6 is a schematic diagram of a liquid crystal display device according to an embodiment of the present invention. The liquid crystal display device includes a liquid crystal panel 1 and a GOA circuit 2. Wherein, the GOA circuit 2 is the GOA circuit in anyone of the above embodiments. Other structure features of the liquid crystal display device is within the understandable range for person of ordinary skilled in the art, no more repeating.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A GOA circuit comprising multiple cascaded GOA units, wherein a N-th stage GOA unit of the multiple cascaded GOA units comprises: a pull-up control module, a pull-up module, a transmission module, a pull-down module, a pull-down maintaining module and a bootstrap capacitor; wherein, the pull-up control module is connected with the transmission module and a pull-down maintaining module, one terminal of the bootstrap capacitor is connected to the transmission module and the pull-up module, the pull-down module is connected to the transmission module and a scanning line of the present stage, the pull-down maintaining module and the pull-down module are also connected with a pull-down signal line, and the pull-up module is connected with a clock signal line and the scanning line of the present stage; the pull-up control module includes a first thin-film transistor (T11), a gate of the first thin-film transistor (T11) is used for receiving a trigger signal of a (N−2)-th stage GOA unit, a source of the first thin-film transistor (T11) is used for connecting a scanning line signal of the (N−2)-th stage GOA unit, and a drain of the first thin-film transistor (T11) is connected with the transmission module and the pull-down maintaining module; the pull-down maintaining module (500) includes a sixth thin-film transistor (T51), a seventh thin-film transistor (T53), an eighth thin-film transistor (T32), a ninth thin-film transistor (T42), a tenth thin-film transistor (T52) and an eleventh thin-film transistor (T54); a gate of the sixth thin-film transistor (T51) is connected with the clock signal line, a source of the sixth thin-film transistor (T51) is connected with a source of the seventh thin-film transistor (T53), a drain of the sixth thin-film transistor (T51) is connected with a gate of the seventh thin-film transistor (T53), and a source of the tenth thin-film transistor (T52); a drain of the seventh thin-film transistor (T53) is connected with a gate of the ninth thin-film transistor (T42) and a source of the eleventh thin-film transistor (T54); a gate of the eighth thin-film transistor (T32) is connected with the clock signal line, a source of the eighth thin-film transistor (T32) is connected with the drain of the first thin-film transistor (T11), and a drain of the eighth thin-film transistor (T32) is connected with the scanning line of the present stage and a source of the ninth thin-film transistor (T42); a drain of the ninth thin-film transistor (T42) is connected with the pull-down signal line; a gate of the tenth thin-film transistor (T52) is connected with a drain of the first thin-film transistor (T11); a drain of the tenth thin-film transistor (T52) is connected with the pull-down signal line; a gate of the eleventh thin-film transistor (T54) is connected with a drain of the first thin-film transistor (T11), a drain of the eleventh thin-film transistor (T54) is connected with the pull-down signal line.

2. A GOA circuit comprising multiple cascaded GOA units, wherein a N-th stage GOA unit of the multiple cascaded GOA units comprises: a pull-up control module, a pull-up module, a transmission module, a pull-down module, a pull-down maintaining module and a bootstrap capacitor; wherein, the pull-up control module is connected with the transmission module and a pull-down maintaining module, one terminal of the bootstrap capacitor is connected to the transmission module and the pull-up module, the pull-down module is connected to the transmission module and a scanning line of the present stage, the pull-down maintaining module and the pull-down module are also connected with a pull-down signal line, and the pull-up module is connected with a clock signal line and the scanning line of the present stage; and wherein the pull-down maintaining module (500) includes a sixth thin-film transistor (T51), a seventh thin-film transistor (T53), an eighth thin-film transistor (T32), a ninth thin-film transistor (T42), a tenth thin-film transistor (T52) and an eleventh thin-film transistor (T54); a gate of the sixth thin-film transistor (T51) is connected with the clock signal line, a source of the sixth thin-film transistor (T51) is connected with a source of the seventh thin-film transistor (T53), a drain of the sixth thin-film transistor (T51) is connected with a gate of the seventh thin-film transistor (T53), and a source of the tenth thin-film transistor (T52); a drain of the seventh thin-film transistor (T53) is connected with a gate of the ninth thin-film transistor (T42) and a source of the eleventh thin-film transistor (T54); a gate of the eighth thin-film transistor (T32) is connected with the clock signal line, a source of the eighth thin-film transistor (T32) is connected with the drain of the first thin-film transistor (T11), and a drain of the eighth thin-film transistor (T32) is connected with the scanning line of the present stage and a source of the ninth thin-film transistor (T42); a drain of the ninth thin-film transistor (T42) is connected with the pull-down signal line; a gate of the tenth thin-film transistor (T52) is connected with a drain of the first thin-film transistor (T11); a drain of the tenth thin-film transistor (T52) is connected with the pull-down signal line; a gate of the eleventh thin-film transistor (T54) is connected with a drain of the first thin-film transistor (T11), a drain of the eleventh thin-film transistor (T54) is connected with the pull-down signal line.

3. The GOA circuit according to claim 2, wherein, the pull-up control module includes a first thin-film transistor (T11), a gate of the first thin-film transistor (T11) is used for receiving a trigger signal of a (N−2)-th stage GOA unit, a source of the first thin-film transistor (T11) is used for connecting a scanning line signal of the (N−2)-th stage GOA unit, and a drain of the first thin-film transistor (T11) is connected with the transmission module and the pull-down maintaining module.

4. The GOA circuit according to claim 3, wherein, the transmission module includes a second thin-film transistor (T22), a gate of the second thin-film transistor (T22) is connected with the drain of the first thin-film transistor (T22), a source of the second thin-film transistor (T22) is connected with the clock signal line, and a drain of the second thin-film transistor (T22) is used for outputting a trigger signal of the present stage GOA unit.

5. The GOA circuit according to claim 4, wherein, the pull-up module includes a third thin-film transistor (T21), a gate of the third thin-film transistor (T21) is connected with the drain of the first thin-film transistor (T11), a source of the third thin-film transistor (T21) is connected with the clock signal, and a drain of the third thin-film transistor (T21) is connected with the scanning line of the present stage.

6. The GOA circuit according to claim 5, wherein, one terminal of the bootstrap capacitor is connected with the gate of the second thin-film transistor (T22) and the gate of the third thin-film transistor (T21), and the other terminal of the bootstrap capacitor is connected with the scanning line of the present stage.

7. The GOA circuit according to claim 6, wherein, the pull-down module includes a fourth thin-film transistor (T41) and a fifth thin-film transistor (T31), a gate of the fourth thin-film transistor (T41) is used for receiving a scanning line signal of a (N+2)-th stage GOA unit, a source of the fourth thin-film transistor (T41) is connected with the drain of the first thin-film transistor (T11), a drain of the fourth thin-film transistor (T41) is connected with the pull-down signal line; a gate of the fifth thin-film transistor (T31) is used for receiving the scanning line signal of the (N+2)-th stage GOA unit, a source of the fifth thin-film transistor (T31) is connected with the scanning line of the present stage, and a drain of the fifth thin-film transistor (T31) is connected with the pull-down signal line.

8. The GOA circuit according to claim 2, wherein, the source of the eighth thin-film transistor (T32) is connected with the drain of the first thin-film transistor (T11) through a first node Q(N).

9. The GOA circuit according to claim 2, wherein, the drain of the seventh thin-film transistor (T53), the gate of the ninth thin-film transistor (T42) and the source of the eleventh thin-film transistor (T54) are connected with each other through a second node P(N).

10. A liquid crystal display device, wherein the liquid crystal display device includes a GOA circuit, and the GOA circuit comprises multiple cascaded GOA units, wherein a N-th stage GOA unit of the multiple cascaded GOA units comprises: a pull-up control module, a pull-up module, a transmission module, a pull-down module, a pull-down maintaining module and a bootstrap capacitor; wherein, the pull-up control module is connected with the transmission module and a pull-down maintaining module, one terminal of the bootstrap capacitor is connected to the transmission module and the pull-up module, the pull-down module is connected to the transmission module and a scanning line of the present stage, the pull-down maintaining module and the pull-down module are also connected with a pull-down signal line, and the pull-up module is connected with a clock signal line and the scanning line of the present stage; and
wherein, the pull-down maintaining module (500) includes a sixth thin-film transistor (T51), a seventh thin-film transistor (T53), an eighth thin-film transistor (T32), a ninth thin-film transistor (T42), a tenth thin-film transistor (T52) and an eleventh thin-film transistor (T54); a gate of the sixth thin-film transistor (T51) is connected with the clock signal line, a source of the sixth thin-film transistor (T51) is connected with a source of the seventh thin-film transistor (T53), a drain of the sixth thin-film transistor (T51) is connected with a gate of the seventh thin-film transistor (T53), and a source of the tenth thin-film transistor (T52); a drain of the seventh thin-film transistor (T53) is connected with a gate of the ninth thin-film transistor (T42) and a source of the eleventh thin-film transistor (T54); a gate of the eighth thin-film transistor (T32) is connected with the clock signal line, a source of the eighth thin-film transistor (T32) is connected with the drain of the first thin-film transistor (T11), and a drain of the eighth thin-film transistor (T32) is connected with the scanning line of the present stage and a source of the ninth thin-film transistor (T42); a drain of the ninth thin-film transistor (T42) is connected with the pull-down signal line; a gate of the tenth thin-film transistor (T52) is connected with a drain of the first thin-film transistor (T11); a drain of the tenth thin-film transistor (T52) is connected with the pull-down signal line; a gate of the eleventh thin-film transistor (T54) is connected with a drain of the first thin-film transistor (T11), a drain of the eleventh thin-film transistor (T54) is connected with the pull-down signal line.

11. The liquid crystal display device according to claim 10, the pull-up control module includes a first thin-film transistor (T11), a gate of the first thin-film transistor (T11) is used for receiving a trigger signal of a (N−2)-th stage GOA unit, a source of the first thin-film transistor (T11) is used for connecting a scanning line signal of the (N−2)-th stage GOA unit, and a drain of the first thin-film transistor (T11) is connected with the transmission module and the pull-down maintaining module.

12. The liquid crystal display device according to claim 11, wherein, the transmission module includes a second thin-film transistor (T22), a gate of the second thin-film transistor (T22) is connected with the drain of the first thin-film transistor (T11), a source of the second thin-film transistor (T22) is connected with the clock signal line, and a drain of the second thin-film transistor (T22) is used for outputting a trigger signal of the present stage GOA unit.

13. The liquid crystal display device according to claim 12, wherein the pull-up module includes a third thin-film transistor (T21), a gate of the third thin-film transistor (T21) is connected with the drain of the first thin-film transistor (T11), a source of the third thin-film transistor (T21) is connected with the clock signal, and a drain of the third thin-film transistor (T21) is connected with the scanning line of the present stage.

14. The liquid crystal display device according to claim 13, wherein, one terminal of the bootstrap capacitor is connected with the gate of the second thin-film transistor (T22) and the gate of the third thin-film transistor (T21), and the other terminal of the bootstrap capacitor is connected with the scanning line of the present stage.

15. The liquid crystal display device according to claim 14, wherein, the pull-down module includes a fourth thin-film transistor (T41) and a fifth thin-film transistor (T31), a gate of the fourth thin-film transistor (T41) is used for receiving a scanning line signal of a (N+2)-th stage GOA unit, a source of the fourth thin-film transistor (T41) is connected with the drain of the first thin-film transistor (T11), a drain of the fourth thin-film transistor (T41) is connected with the pull-down signal line; a gate of the fifth thin-film transistor (T31) is used for receiving the scanning line signal of the (N+2)-th stage GOA unit, a source of the fifth thin-film transistor (T31) is connected with the scanning line of the present stage, and a drain of the fifth thin-film transistor (T31) is connected with the pull-down signal line.

16. The liquid crystal display device according to claim 10, wherein, the source of the eighth thin-film transistor (T32) is connected with the drain of the first thin-film transistor (T11) through a first node Q(N).

17. The liquid crystal display device according to claim 10, wherein, the drain of the seventh thin-film transistor (T53), the gate of the ninth thin-film transistor (T42) and the source of the eleventh thin-film transistor (T54) are connected with each other through a second node P(N).

* * * * *